United States Patent
Iwasaki (10) Patent No.: US 9,693,483 B2
(45) Date of Patent: Jun. 27, 2017

(54) COOLING DEVICE FOR HEAT-GENERATING DEVICES

(71) Applicant: FUJITSU LIMITED, Kawasaki-shi, Kanagawa (JP)

(72) Inventor: Fuminobu Iwasaki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/867,399

(22) Filed: Sep. 28, 2015

(65) Prior Publication Data

US 2016/0100504 A1    Apr. 7, 2016

(30) Foreign Application Priority Data

Oct. 1, 2014    (JP) .................................. 2014-203437

(51) Int. Cl.
*H05K 7/20*    (2006.01)
*G11B 33/14*    (2006.01)

(52) U.S. Cl.
CPC ..... *H05K 7/20781* (2013.01); *G11B 33/1413* (2013.01); *H05K 7/20272* (2013.01)

(58) Field of Classification Search
CPC ........... H05K 7/20218; H05K 7/20272; H05K 7/20781; G11B 33/1413
USPC ....................................................... 361/688
See application file for complete search history.

(56) References Cited

U.S. PATENT DOCUMENTS

| | | | |
|---|---|---|---|
| 4,493,010 A * | 1/1985 | Morrison | H05K 7/20636 165/104.33 |
| 5,675,473 A * | 10/1997 | McDunn | H05K 9/0037 165/80.4 |
| 6,496,362 B2 * | 12/2002 | Osterhout | G11B 33/08 206/586 |
| 6,807,056 B2 * | 10/2004 | Kondo | G06F 1/20 165/104.33 |
| 6,836,407 B2 * | 12/2004 | Faneuf | G06F 1/20 165/80.3 |
| 6,999,316 B2 * | 2/2006 | Hamman | F28D 1/0535 165/104.31 |

(Continued)

FOREIGN PATENT DOCUMENTS

| | | |
|---|---|---|
| JP | 5-267875 | 10/1993 |
| JP | 7-245363 | 9/1995 |

(Continued)

*Primary Examiner* — Anatoly Vortman
(74) *Attorney, Agent, or Firm* — Staas & Halsey LLP (57) ABSTRACT

A cooling device for heat-generating devices that are removably inserted into a plurality of slots formed in a cabinet of an electronic apparatus, the cooling device includes: a first cooling device provided in the electronic apparatus; a second cooling device provided outside the electronic apparatus; and a flexible tube that interconnects the first cooling device and the second cooling device so that a coolant is circulated; wherein the first cooling device includes a coolant flow path that is connected to one end of the flexible tube, the coolant flow path cooling both side surfaces of each of the plurality of slots, wherein the second cooling device includes a connector connected to another end of the flexible tube, a cooling unit that cools the coolant, which enters the second cooling device through the flexible tube, and a pump that feeds out the coolant, which has been cooled, to the flexible tube.

20 Claims, 8 Drawing Sheets

(56) References Cited

U.S. PATENT DOCUMENTS

| | | | | |
|---|---|---|---|---|
| 7,012,807 B2* | 3/2006 | Chu | ............................ | G06F 1/20 |
| | | | | 165/104.33 |
| 7,333,334 B2* | 2/2008 | Yamatani | ................... | G06F 1/20 |
| | | | | 165/122 |
| 7,457,118 B1* | 11/2008 | French | ................ | H05K 7/20936 |
| | | | | 361/679.48 |
| 7,586,741 B2* | 9/2009 | Matsushima | ............ | G06F 1/206 |
| | | | | 361/679.46 |
| 7,675,748 B2* | 3/2010 | Matsushima | ......... | G11B 33/128 |
| | | | | 361/679.47 |
| 7,903,403 B2* | 3/2011 | Doll | ............................ | G06F 1/20 |
| | | | | 361/679.48 |
| 8,611,083 B2* | 12/2013 | Kumlin | ...................... | G06F 1/20 |
| | | | | 165/108 |
| 2004/0008483 A1* | 1/2004 | Cheon | ......................... | G06F 1/20 |
| | | | | 361/679.53 |
| 2004/0221604 A1* | 11/2004 | Ota | ..................... | H05K 7/20781 |
| | | | | 62/259.2 |
| 2004/0264133 A1* | 12/2004 | Fukuda | ................. | G11B 33/142 |
| | | | | 361/695 |
| 2015/0000864 A1* | 1/2015 | Kobayashi | .......... | H05K 7/20636 |
| | | | | 165/46 |

FOREIGN PATENT DOCUMENTS

| | | |
|---|---|---|
| JP | 10-326484 | 12/1998 |
| WO | WO 2013/140531 A1 | 9/2013 |

\* cited by examiner

BEFORE CONNECTION

AFTER CONNECTION

COOLING DEVICE FOR HEAT-GENERATING DEVICES

CROSS-REFERENCE TO RELATED APPLICATION

This application is based upon and claims the benefit of priority of the prior Japanese Patent Application No. 2014-203437, filed on Oct. 1, 2014, the entire contents of which are incorporated herein by reference.

FIELD

The embodiments discussed herein are related to a cooling device for, for example, heat-generating devices.

BACKGROUND

Figure 1A:
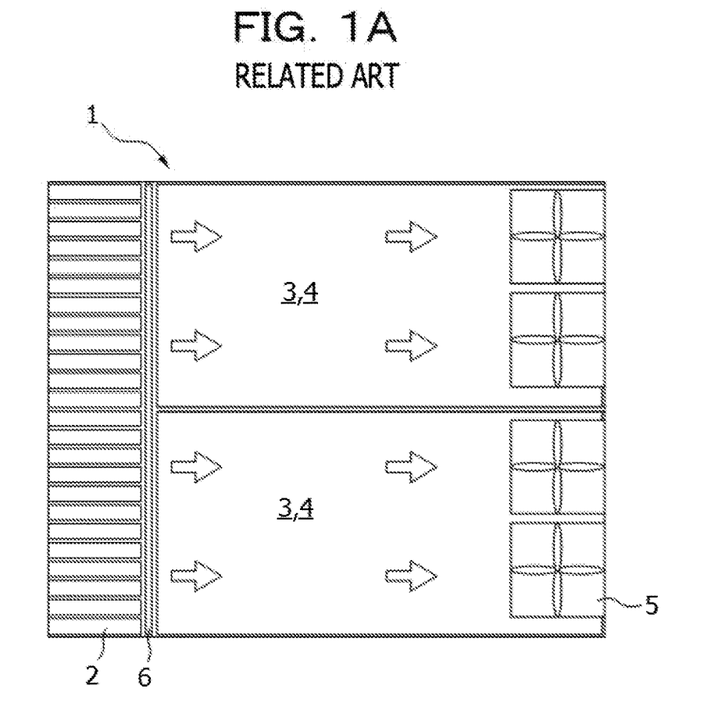
FIG. 1A is a plan view of a cooling device, in related art, that cools hard disks.
Figures 1B, 1C:
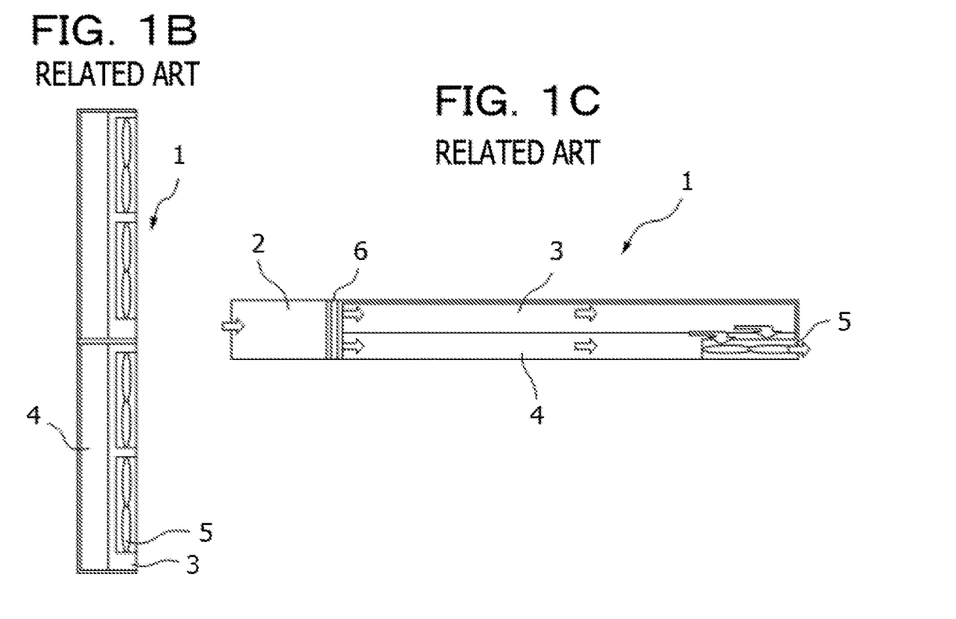
FIG. 1B is a rear view of the cooling device, illustrated in FIG. 1A, for hard disks.
FIG. 1C is a side view of the cooling device, illustrated in FIG. 1A, for hard disk drives.

A known conventional large-capacity storage apparatus, which is a type of electronic apparatus, includes many storage devices such as hard disk drives. FIGS. 1A, 1B, and 1C illustrate an example of related art of this type of large-capacity storage apparatus. In the large-capacity storage apparatus 1 in these drawings, many hard disk drives 2 are mounted side by side at one end of the cabinet of the large-capacity storage apparatus 1. A control unit 3 and a power supply unit 4 are placed at a central portion of the cabinet of the large-capacity storage apparatus 1. A blower fan 5 for use in air cooling is provided at another end of the cabinet of the large-capacity storage apparatus 1. The blower fan 5 inhales cooling air, which is supplied from the side on which the hard disk drives 2 are mounted, from above, and exhales the air to the back. A backplane 6, which is a partitioning wall, is provided between the hard disk drives 2 and the control unit 3 and power supply unit 4. The control unit 3 and power supply unit 4 are duplicated, forming a redundant structure.

The large-capacity storage apparatus 1 having this type of structure has been problematic in that since a large amount of air is used to cool the hard disk drives 2 and the blower fan 5 thereby has a large blowing capacity. This has increased fan noise and has caused the blower fan 5 to consume much power. In view of this, a technology to cool heat-generating electronic parts by use of a water-cooling device instead of air cooling is described in, for example, Japanese Laid-open Patent Publication No. 5-267875. With the water-cooling device, intended for a printed-circuit board, described in Japanese Laid-open Patent Publication No. 5-267875, a fitting plate is used to removably attach a water-cooling head to a printed circuit board. The water-cooling head is formed like a flexible bag, which is deformed so as to follow the outer shapes of parts mounted on the printed-circuit board. A coolant circulates in the water-cooling head. The water-cooling head is connected to a thermo transfer unit with a hose; after having circuited in the water-cooling head, the cooling water is cooled in the thermo transfer unit and is returned to the water-cooling head. A similar cooling-water device is proposed in, for example, Japanese Laid-open Patent Publication No. 7-245363. In this cooling-water device, a power semiconductor device is mounted on one surface of a semiconductor module attaching plate and a heat transfer plate in contact with a coolant is mounted on another surface of the semiconductor module attaching plate.

SUMMARY

In accordance with an aspect of the embodiments, a cooling device for heat-generating devices that are removably inserted into a plurality of slots formed in a cabinet of an electronic apparatus, the cooling device includes: a first cooling device provided in the electronic apparatus; a second cooling device provided outside the electronic apparatus; and a flexible tube that interconnects the first cooling device and the second cooling device so that a coolant is circulated; wherein the first cooling device includes a coolant flow path that is connected to one end of the flexible tube, the coolant flow path cooling both side surfaces of each of the plurality of slots, wherein the second cooling device includes a connector connected to another end of the flexible tube, a cooling unit that cools the coolant, which enters the second cooling device through the flexible tube, and a pump that feeds out the coolant, which has been cooled, to the flexible tube through the connector, and wherein the second cooling device is capable of being connected through the flexible tube to the first cooling device provided in each of a plurality of electronic devices.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

These and/or other aspects and advantages will become apparent and more readily appreciated from the following description of the embodiments, taken in conjunction with the accompanying drawing of which.

DESCRIPTION OF EMBODIMENTS

Embodiments of this application will be described with reference to the attached drawings, by using specific examples. In the description below, the same constituent members as with the cooling device, in related art illustrated in FIGS. 1A to 1C, that cools hard disks will be assigned the same reference numerals.

Figure 2:
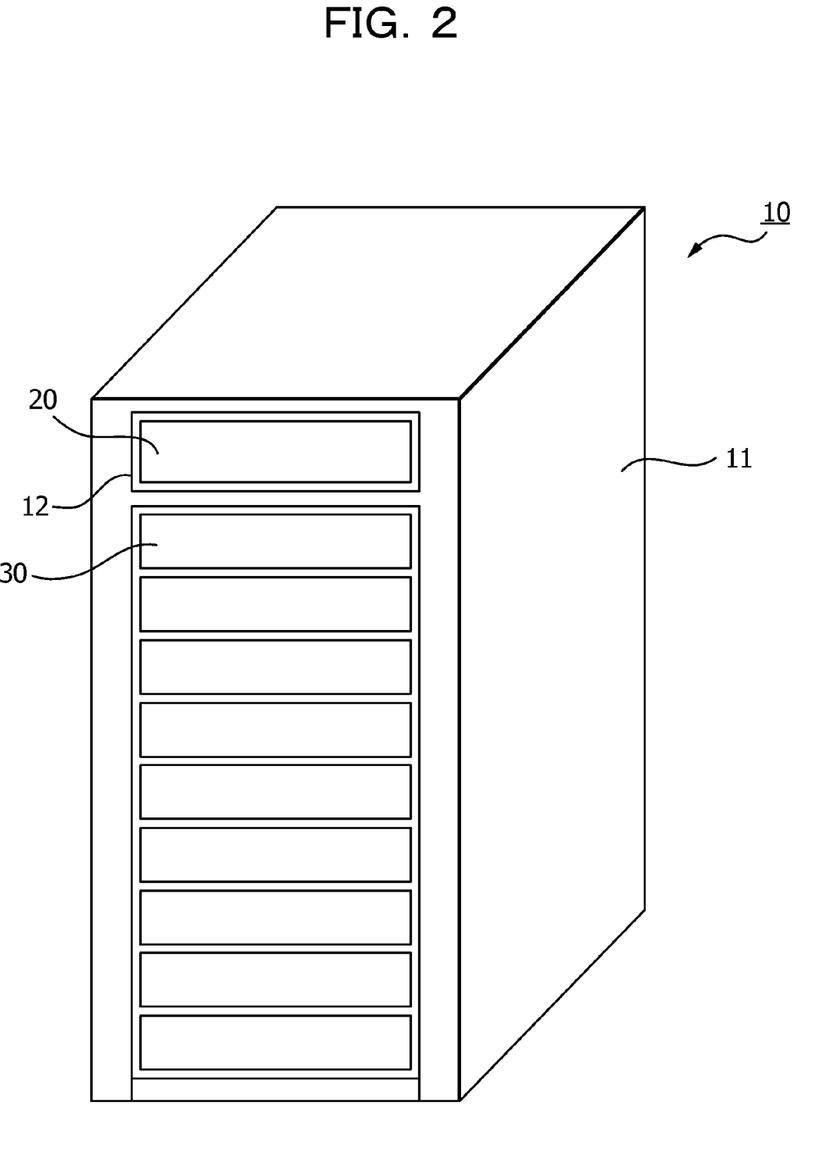
FIG. 2 is a perspective view illustrating the outside shape of a storage system that includes an external cooling device and a plurality of large-capacity storage apparatuses, the external cooling device and the plurality of large-capacity storage apparatuses each having a cooling device, in this application, for heat-generating devices.

FIG. 2 illustrates a storage system 10 that includes a cooling device, in this application, for heat-generating devices. A rack 11 included in the storage system 10 has a plurality of shelves 12. Each shelf 12 may accommodate a large-capacity storage apparatus 30, which is a type of electronic apparatus, or an apparatus with a comparable size. The large-capacity storage apparatus 30 may accommodate a plurality of hard disk drives, which are heat-generating devices. The cooling device, in this application, for heat-generating devices is divided into two types of cooling devices, a first cooling device and an external cooling device 20. The first cooling device is disposed in each large-capacity storage apparatus 30, and the external cooling device 20 is disposed outside the large-capacity storage apparatuses 30, each of which has the first cooling device. The first cooling device and a second cooling device are mutually connected with a flexible pipe, which will be described later.

In a first embodiment, the second cooling device is the external cooling device 20, which is placed in a shelf 12 at the top of the rack 11. The plurality of large-capacity storage apparatuses 30 are placed in a second shelf 12 to a shelf 12 at the bottom. The number of shelves 12 varies with the size of the storage system 10, so there is no limitation on that number. Although, in this embodiment, the external cooling device 20 is placed in the shelf 12 at the top of the rack 11, this is not a limitation; the external cooling device 20 may be placed in any shelf 12.

Figure 3:
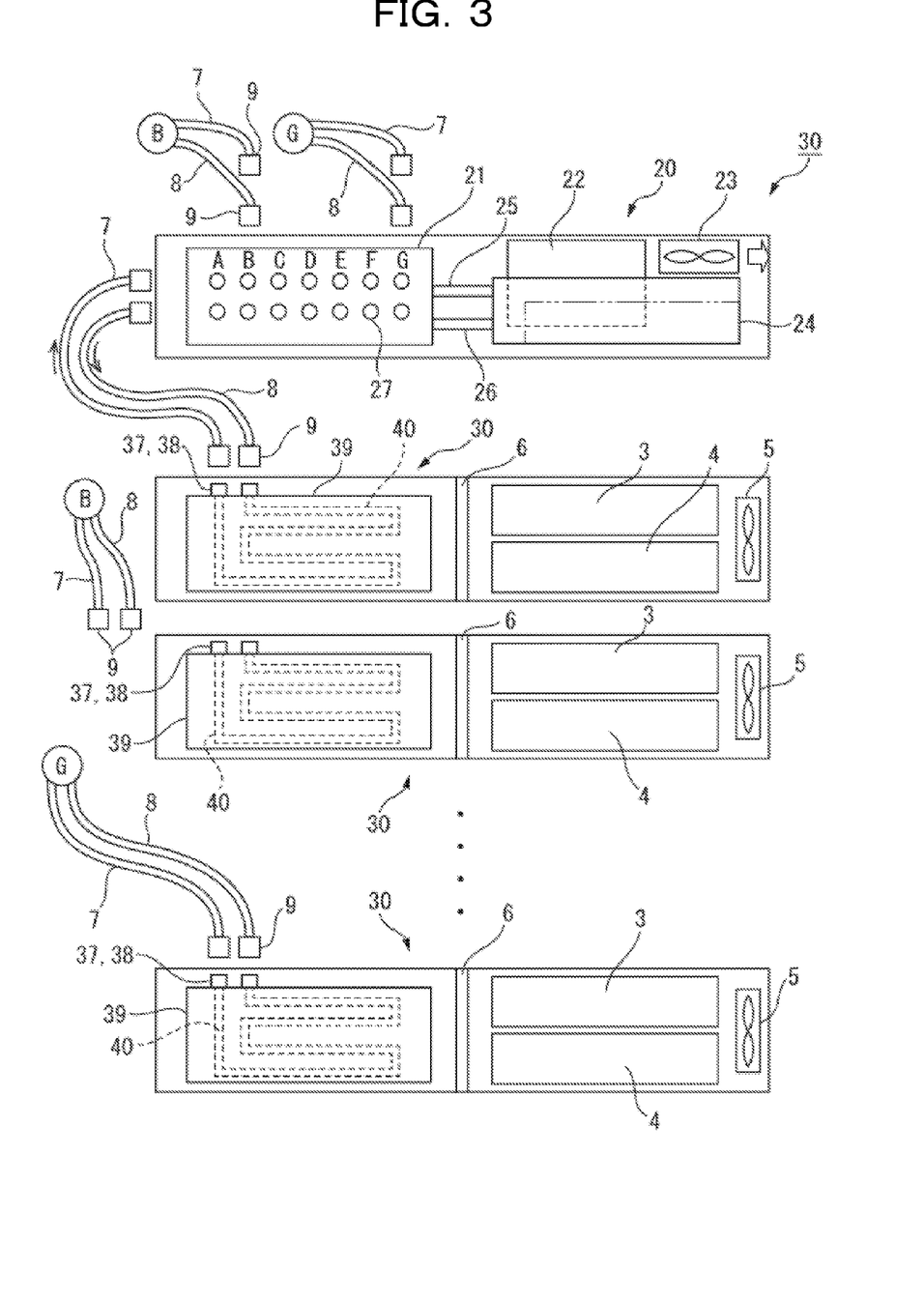
FIG. 3 illustrates the internal structures of the external cooling device and large-capacity storage apparatus, which are both included in the storage system in FIG. 2, as well as their cooling structures.

FIG. 3 illustrates the internal structures of the external cooling device 20 and large-capacity storage apparatus 30, which are both included in the storage system 10 in FIG. 2, as well as the above-mentioned cooling structures. In FIG. 3, the rack 11 in the storage system 10 is not illustrated. First, the structure of the external cooling device 20 will be described. The external cooling device 20 includes a pump 21 and a coolant tank 24 to which a heat sink 22 and a fan 23 are attached, and also has a hot water pipe 25 and a cold water pipe 26, which mutually connect the pump 21 and coolant tank 24. Two types of connection tubes 7 and 8, which are a supply tube 7 through which a coolant is fed and a discharge tube 8 through which the coolant is discharged, are connected to the pump 21 with connection connectors 27 (A-G). The coolant flows through the supply tube 7 and discharge tube 8 in directions of the arrows indicated beside these connection tubes. The number of connection connectors 27 is the same as the number of supply tubes 7 and discharge tubes 8 that may be connected to the pump 21. In an example in FIG. 3, to simplify an explanation, 14 connection connectors 27 are illustrated; although this number of connection connectors 27 is smaller the number of large-capacity storage apparatuses 30 in FIG. 2, there is no limitation on the number of connection connectors 27.

Figure 4A:
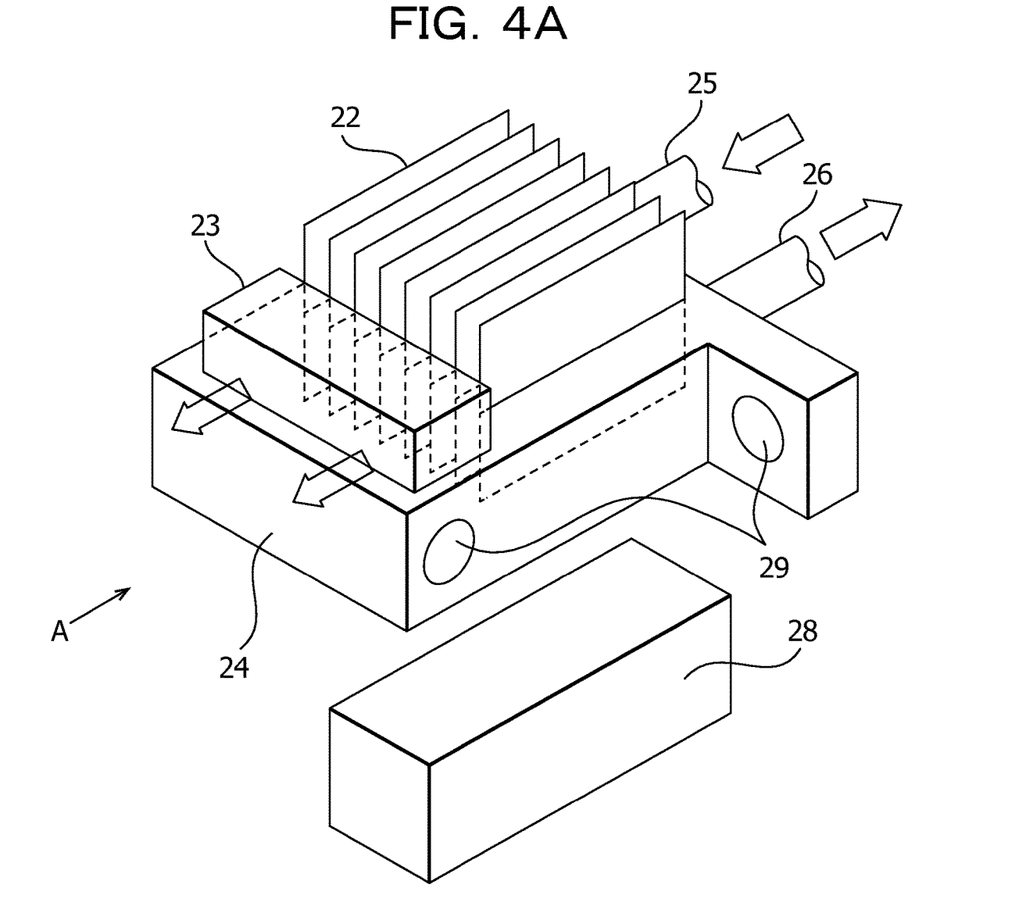
FIG. 4A is a perspective view illustrating an example of the structure of a coolant tank in the external cooling device in FIG. 3 and an additional tank.
Figure 4B:
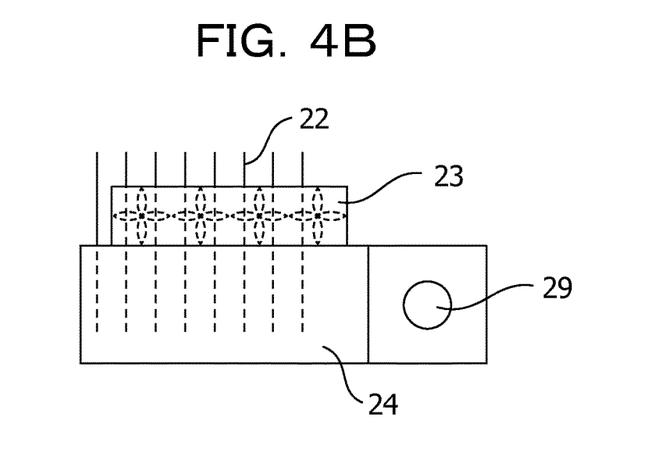
FIG. 4B is a perspective view of the coolant tank in FIG. 4A when viewed in the direction indicated by the arrow A.

The coolant tank 24 is connected to the pump 21 with the hot water pipe 25 and cold water pipe 26. A hot coolant is supplied from the pump 21 to the coolant tank 24 through the hot water pipe 25. The coolant is cooled in the coolant tank 24, and the cold coolant is returned to the pump 21 through the cold water pipe 26. The heat sink 22 and fan 23, which cool the coolant that has flowed into the coolant tank 24, are attached to the coolant tank 24, as illustrated in FIG. 4A and FIG. 4B, which is viewed in the direction of the arrow A in FIG. 4A. The heat sink 22 has a portion extending toward the outside of the coolant tank 24 and a portion extending toward the inside of the coolant tank 24 so that the heat of the coolant is released to the outside to cool the coolant. The fan 23 blows cooling air to the heat sink 22 to increase the coolant cooling effect by the heat sink 22.

The capacity of the coolant tank 24 in this embodiment may be changed according to the number of large-capacity storage apparatuses 30 accommodated in the rack 11 in the storage system 10 illustrated in FIG. 2, as illustrated in FIG. 4A. Specifically, when the number of large-capacity storage apparatuses 30 accommodated in the rack 11 in the storage system 10 is small, an additional tank 28 is removed so that the coolant tank 24 has a small capacity. When the number of large-capacity storage apparatuses 30 accommodated in the rack 11 in the storage system 10 becomes large, the additional tank 28 is connected to connection ports 29 to increase the capacity of the coolant tank 24. The heat sink 22 may also be attached to the additional tank 28.

The large-capacity storage apparatus 30 in this embodiment has a portion, in front of a backplane 6, in which hard disk drives are mounted, and includes a control unit 3, a power supply unit 4, and a blower fan 5 behind the backplane 6, as in the large-capacity storage apparatus 1, which has been described with reference FIGS. 1A, 1B, and 1C as a comparative technology. In this application, the control unit 3, power supply unit 4, and blower fan 5 disposed behind the backplane 6 of the large-capacity storage apparatus 30 have no feature. Only an example of their placement is illustrated in FIG. 5A and further description will be omitted.

Figure 5A:
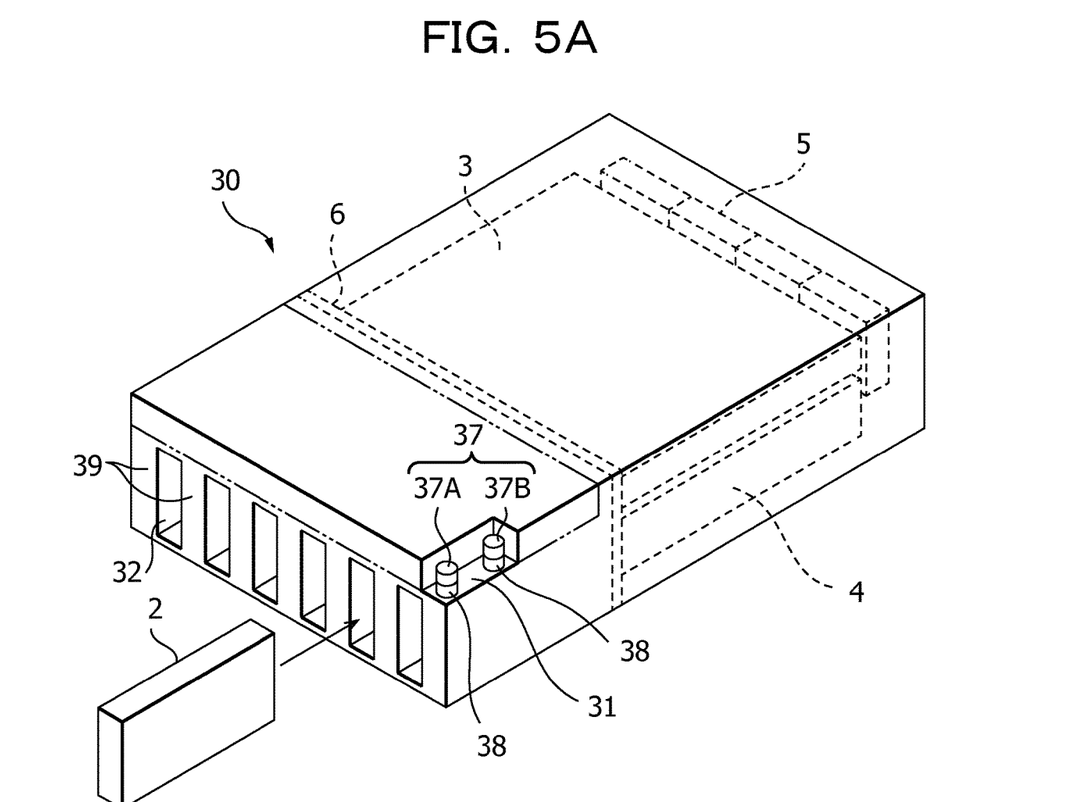
FIG. 5A is a perspective view illustrating a structure in a first embodiment of the large-capacity storage apparatus in FIG. 3.

In front of the backplane 6 in the large-capacity storage apparatus 30, slots 32 and a recess 31 are formed as illustrated in FIG. 5A; hard disk drives 2 are mounted in the slots 32, and two connection connectors 37, to which the supply tube 7 and discharge tube 8 in FIG. 3 are connected, are disposed in the recess 31. The connection connector 37 through which the coolant is supplied will be referred to as a first connection connector 37A, and the connection connector 37 through which the coolant is discharged will be referred to as a second connection connector 37B. Walls at both sides of each slot 32 are cooling plates 39 that cool the hard disk drive 2 inserted into the slot 32. Connector bases 38 are provided on the recess 31. The two connection connectors 37A and 37B are integrally attached to their corresponding connector bases 38. A connection connector 9 at one end of the discharge tube 8 is connected to the connection connector 37A, the discharge tube 8 being led from one connection connector 27 on the external cooling device 20. Another connection connector 9 at one end of the supply tube 7 is connected to the connection connector 37B, the supply tube 7 being led to one connection connector 27 on the external cooling device 20.

The number of hard disk drives 2 mounted in the actual large-capacity storage apparatus 30 is a large number exceeding 20 as in, for example, the large-capacity storage apparatus 1 illustrated in FIG. 1A as a comparative technology. In FIG. 5A, however, only six hard disk drives 2 are mounted to simplify explanation. Each of the cooling plates 39 at both ends of the slot 32 is a rigid body and its actual thickness is thin as in the large-capacity storage apparatus 1 illustrated in FIG. 1A as a comparative technology. Although, in this embodiment, the two connection connectors 37A and 37B are disposed on the right side when viewed from the front of the large-capacity storage apparatus 30, there is no particular limitation on positions at which the two connection connectors 37A and 37B are disposed.

Figure 5B:
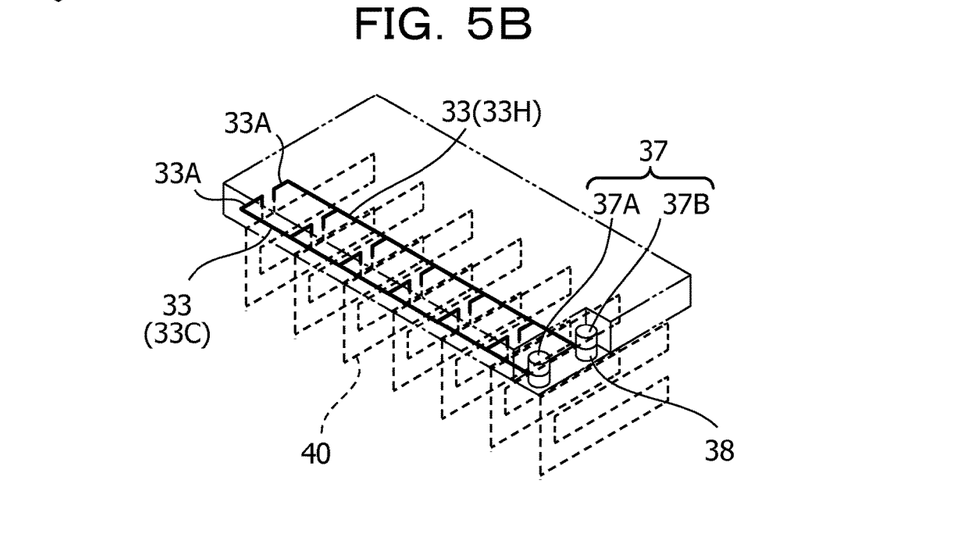
FIG. 5B illustrates a cooling structure provided in the large-capacity storage apparatus in FIG. 5A.

FIG. 5B illustrates the structure of the first cooling device provided in the large-capacity storage apparatus 30 in FIG. 5A. Manifolds 33 extending in the width direction of the large-capacity storage apparatus 30 are attached to the connector bases 38, to which the two connection connectors 37A and 37B are attached. Since the cold coolant flows into the connection connector 37A, the manifold 33 connected to the connection connector 37A is a low-temperature manifold 33C. Since the hot coolant flows out of the connection connector 37B, the manifold 33 connected to the connection connector 37B is a high-temperature manifold 33H. A coolant flow path 40, through which the coolant flows, is provided inside the cooling plate 39. The coolant flow path 40 in the cooling plate 39 is bent so that the cooling plate 39 is uniformly cooled by the coolant. There is no particular limitation on the shape of the coolant flow path 40.

One end of the coolant flow path 40 incorporated into each cooling plate 39 is connected to one of branching tubes 33A that branch from the low-temperature manifold 33C extending from the connector base 38 to which the connection connector 37A connected to the discharge tube 8 is attached. Similarly, the other end of the coolant flow path 40 incorporated into the cooling plate 39 is connected to one of branching tubes 33A that branch from the high-temperature manifold 33H extending from the connector base 38 to which the connection connector 37B connected to the supply tube 7 is attached. In this embodiment, however, in the cooling plate 39 disposed immediately below the connector bases 38, the coolant flow path 40 is connected directly to the connector bases 38 without passing through the manifolds 33, as illustrated in FIG. 3.

Figure 6A:
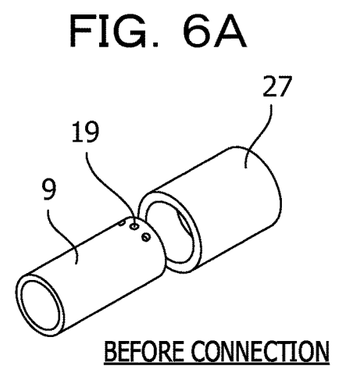
FIG. 6A is a perspective view illustrating the outside shape of a connection connector provided at both ends of a supply tube and a discharge tube and the outside shape of a connection connector provided on the coolant tank and a cooling plate, these connection connectors being illustrated in FIG. 3.
Figures 6B, 6C:
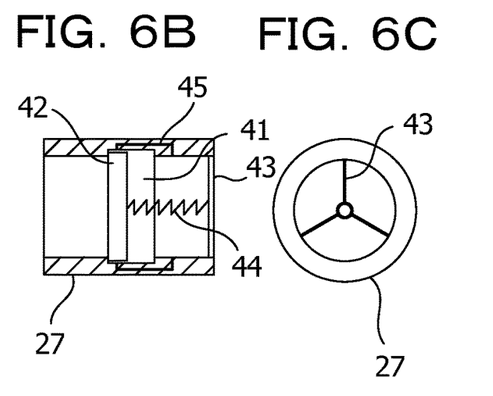
FIG. 6B is a cross-sectional view of the connection connector, in FIG. 6A, which is provided on the coolant tank and a cooling plate.
FIG. 6C is a front view of the connection connector in FIG. 6B.
Figure 6D:
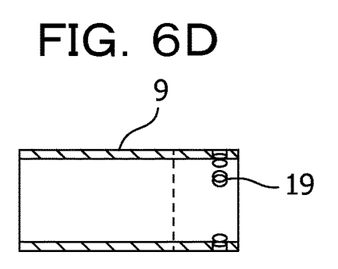
FIG. 6D is a cross-sectional view of the connection connector, in FIG. 6A, which is provided at both ends of the supply tube and the discharge tube.
Figure 6E:
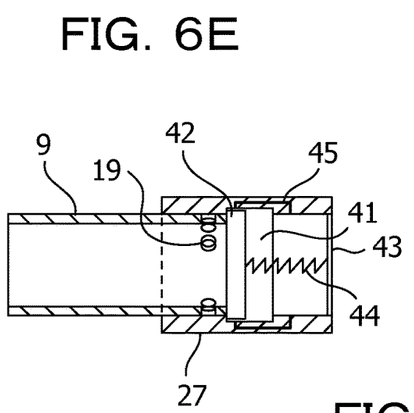
FIG. 6E is a cross-sectional view illustrating a state immediately before the connection connector in FIG. 6D is inserted into and coupled to the connection connector in FIG. 6B.
Figure 6F:
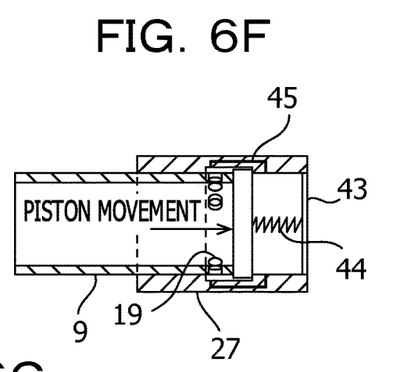
FIG. 6F is a cross-sectional view illustrating a state in which the male and female connection connectors in FIG. 6E are mutually coupled.
Figure 6G:
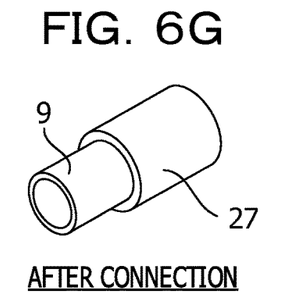
FIG. 6G is a perspective view illustrating a coupled state of the male and female connection connectors in FIG. 6F.

FIG. 6A illustrates the outside shape of the connection connector 9 provided at both ends of the supply tube 7 and discharge tube 8 and the outside shape of the connection connector 27 provided on the coolant tank 24, these connectors being illustrated in FIG. 3. The connection connector 37 disposed in the cooling plate 39 may be completely the same as the connection connector 27 disposed on the coolant tank 24, so a description of the connection connector 37 will be omitted below and the connection connector 27 will be described as a typified example. FIG. 6B is a cross-sectional view of the connection connector 27. FIG. 6C illustrates the connection connector 27 viewed from the same side as the coolant tank 24. FIG. 6D is a cross-sectional view of the connection connector 9. FIG. 6E is a cross-sectional view illustrating a state immediately before the connection connector 9 is inserted into and coupled to the connection connector 27. FIG. 6F is a cross-sectional view illustrating a state in which the connection connectors 9 and 27 in FIG. 6E are mutually coupled, and FIG. 6G illustrates the outside shapes of the connection connectors 9 and 27 that are mutually coupled as illustrated in FIG. 6F.

In this embodiment, the connection connector 27 disposed on the coolant tank 24 and the connection connectors 37A and 37B are each a female connector, and the connection connector 9 disposed at both ends of the supply tube 7 and discharge tube 8 is a male connector. A flexible tube is connected to the connection connector 9. A plurality of communication holes 19, which communicate with an internal space of the connection connector 27, are formed around an end of the connection connector 9, the end being near the connection connector 27.

The connection connector 27 has an enlarged-diameter portion 41 at an intermediate point on the internal circumferential surface of the connection connector 27. An opening/closing valve 42 is slidably provided at the enlarged-diameter portion 41. The opening/closing valve 42 is biased toward an opening, in the connection connector 27, into which the connection connector 9 is inserted, with a spring 44 attached to a stay 43 (see FIG. 6C) disposed in an opening, in the connection connector 27, on the same side as the coolant tank 24. When the opening/closing valve 42 is biased, it closes the flow path in the connection connector 27. When the connection connector 9 is inserted into the connection connector 27, the opening/closing valve 42 is pressed by the end of the connection connector 9. Then, the opening/closing valve 42 moves in the enlarged-diameter portion 41 against the biased force of the spring 44.

A flow path 45 is formed in a thickened part of the connection connector 27 on the outer side of the enlarged-diameter portion 41. When the opening/closing valve 42 is pressed by the end of the inserted connection connector 9 and moves in the enlarged-diameter portion 41 by a predetermined distance, the flow path 45 communicates with both sides of the opening/closing valve 42. In a state in which the connection connector 9 is not connected, an opening, in the flow path 45, into which the connection connector 9 is connected is closed by the outer circumferential part of the opening/closing valve 42. When the opening/closing valve 42 is moved by the inserted connection connector 9, the opening coincides with the communication holes 19 in the connection connector 9. An opening formed in the flow path 45 on the same side as the coolant tank 24 is located at a position at which the opening is not closed by the opening/closing valve 42 even when the opening/closing valve 42 is pressed by the inserted connection connector 9 and moves.

When the connection connector 9 is inserted into the connection connector 27 having the structure described above and the opening/closing valve 42 is thereby pressed, the connection connector 27 enters the state illustrated in FIG. 6F. When this state is entered, spaces on both sides of the opening/closing valve 42 communicate with the flow path 45, enabling the coolant to flow. In this state, the opening/closing valve 42 has reached the end of the enlarged-diameter portion 41 on the same side as the coolant tank 24, so the opening/closing valve 42 is unable to further move. When the connection connector 9 is removed from the connection connector 27, the opening/closing valve 42 is pressed by the spring 44, moves in the enlarged-diameter portion 41, and comes into tight contact with a step formed at another end of the enlarged-diameter portion 41, closing the connection connector 27. At that time, the opening, in the flow path 45, into which the connection connector 9 is inserted is closed by the outer circumferential portion of the opening/closing valve 42. In a state in which the connection connector 9 is not connected to the connection connector 27, therefore, the connection connector 27 is closed, suppressing the coolant in the coolant tank 24 from leaking from the connection connector 27.

Figure 7:
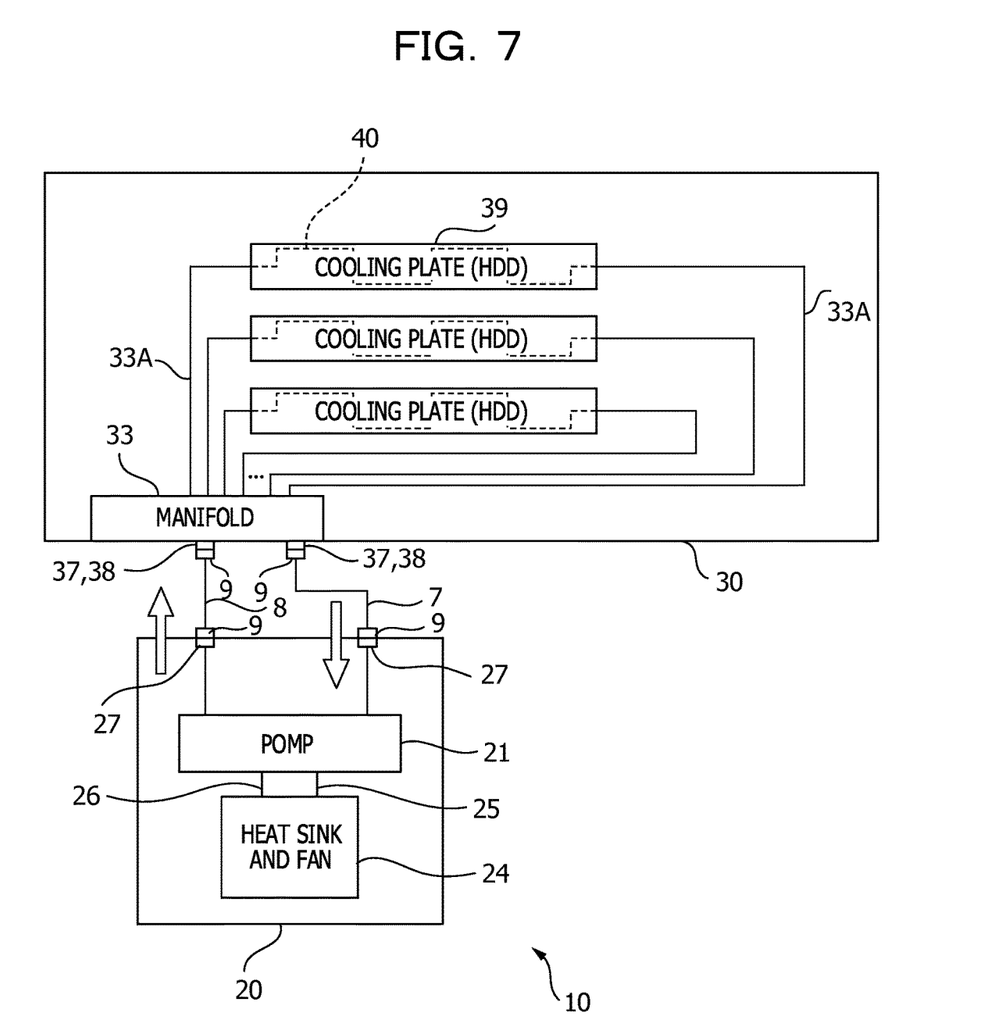
FIG. 7 is a block diagram illustrating a connection between the cooling structures of the external cooling device and large-capacity storage apparatus, which are included in the storage system in FIG. 3.

FIG. 7 is a block diagram illustrating a connection between the cooling structures of the external cooling device 20 and large-capacity storage apparatus 30, which are included in the storage system 10 in FIG. 3. One of the connection connectors 9 at both ends of the supply tube 7 illustrated in FIG. 3 is connected to a connection connector 27 on the pump 21, and the other is connected to the connection connector 37 of its corresponding large-capacity storage apparatus 30. This is also true for the discharge tube 8 illustrated in FIG. 3; the connection connectors 9 at both ends are connected to a connection connector 27 on the pump 21 and the connection connector 37 of its corresponding large-capacity storage apparatus 30. Then, the coolant discharged from the pump 21 flows through the discharge tube 8, the connection connectors 9 and 37A, their corresponding connector base 38, the manifold 33C, and its branching tubes 33A, enters the cooling plates 39, and flows through the coolant flow path 40, cooling the cooling plates 39. As a result, the hard disk drive 2 (see FIG. 5A) inserted into the slot 32 between each two cooling plates 39 is cooled.

After the coolant has flowed through the coolant flow path 40 in each cooling plate 39, the coolant enters the high-temperature manifold 33H through the branching tubes 33A, flows through the corresponding connector base 38, the connection connectors 37B and 9, the supply tube 7, and the connection connectors 9 and 27, and flows back into the pump 21. The coolant, which has returned to the pump 21, flows through the hot water pipe 25, and is fed to the coolant tank 24, where the coolant is cooled by the heat sink 22 and fan 23, lowering the temperature of the coolant. The coolant at a low temperature flows through the cold water pipe 26 and returns to the pump 21, after which the coolant flows again through the discharge tube 8 and is supplied to the cooling plates 39.

With the cooling device as structured above, for heat-generating devices, in this application, a cooling device is provided outside large-capacity storage apparatuses, so the structure of the large-capacity storage apparatus is simplified, achieving a lower cost than when a cooling device is provided in each large-capacity storage apparatus. Even if additional large-capacity storage apparatuses are accommodated in the storage system, the heat capacity may be increased by increasing the capacity of the coolant tank in the external cooling device.

Figure 8A:
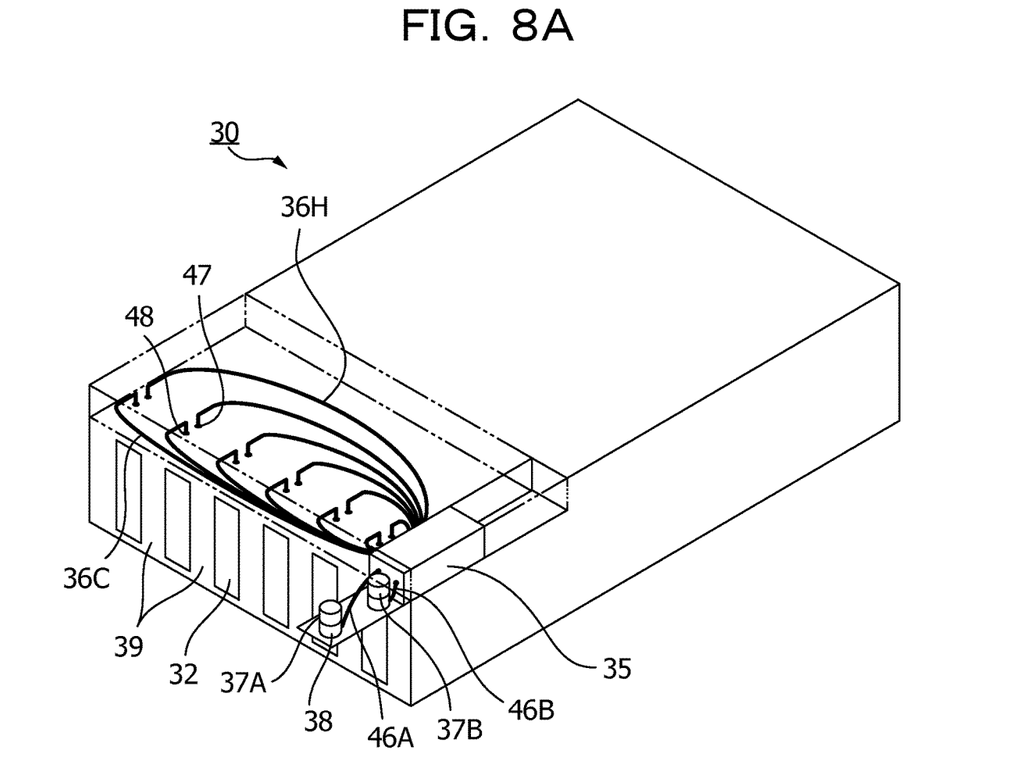
FIG. 8A is a partial transparent perspective view illustrating a structure in a second embodiment of the large-capacity storage apparatus in FIG. 5A.

FIG. 8A illustrates a structure in a second embodiment of the large-capacity storage apparatus 30 in FIG. 5A, illustrating the structure of coolant routes from the connection connectors 37A and 37B to the cooling plates 39. The second embodiment differs from the first embodiment in that the connection connectors 37A and 37B are provided so that they may be pulled forward from the large-capacity storage apparatus 30. In the second embodiment, therefore, a manifold 35 is disposed behind the connection connectors 37A and 37B. The two connection connectors 37A and 37B and the manifold 35 are mutually connected with two connection tubes 46A and 46B.

Flexible pipes 36 are provided between the manifold 35 and the coolant outlet 47 of each cooling plate 39 and between the manifold 35 and the coolant inlet 48 of the cooling plate 39. The connection connector 37A, into which the cold coolant flows, is connected to the manifold 35 with the connection connector 46A. In the manifold 35, the cold coolant branches into a plurality of flow paths, each of which is connected to a first flexible pipe 36C. Each flexible pipe 36C is connected to the coolant inlet 48. Therefore, the cold coolant supplied to the connection connector 37A is distributed to the cooling plates 39. Second flexible pipes 36H, which are connected to their relevant coolant outlets 47 and through which the hot coolant flows, are combined together in the manifold 35. Therefore, the coolant discharged from each cooling plate 39 joins in the manifold 35, flows through the connection connector 46B and its corresponding connector base 38, and is discharged from the connection connector 37B.

Figure 8B:
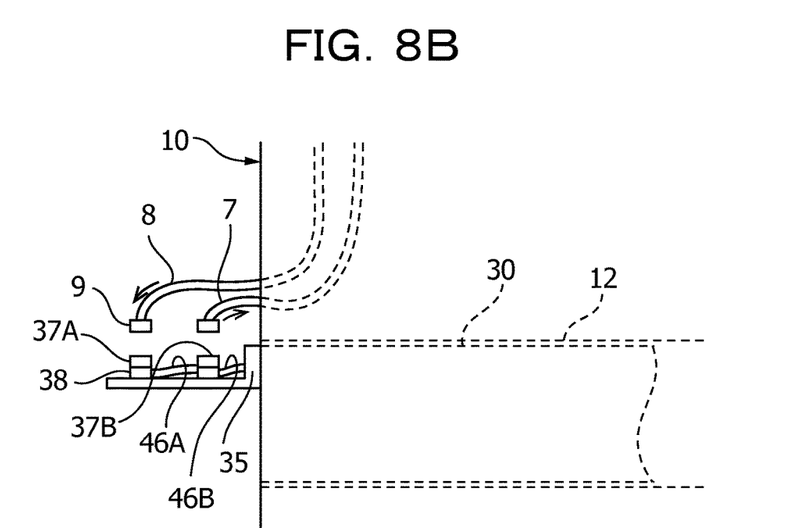
FIG. 8B is a partial side view illustrating a connection between the external cooling device and the large-capacity storage apparatus in FIG. 8A.

FIG. 8B illustrates a connection between the external cooling device 20 (see FIG. 3) and the large-capacity storage apparatus 30 in FIG. 8A. As described above, the external cooling device 20 includes, on the pump 21, as many connection connectors 27 connected to large-capacity storage apparatuses 30 as twice the number of shelves 12 in the rack 11. If an additional large-capacity storage apparatus 30 is inserted into a free shelf 12, a supply tube 7 and discharge tube 8 that have a length long enough to reach that shelf 12 are connected to the external cooling device 20. The supply tube 7 and discharge tube 8 with the connection connector 9 attached to their ends are lowered to the position of the additional large-capacity storage apparatus 30. With the large-capacity storage apparatus 30 in the second embodiment, the connection connectors 37A and 37B and the manifold 35 may be pulled forward from the main body.

Thus, after the additional large-capacity storage apparatus 30 has been accommodated in the shelf 12 in the storage system 10, the connection connectors 37A and 37B are pulled forward from the main body. In front of the storage system 10, the connection connector 9 connected to the supply tube 7 is connected to the connection connector 37B, and the connection connector 9 connected to the discharge tube 8 is connected to the connection connector 37A. After the connection connectors 9 have been connected to the connection connectors 37A and 37B, the connection connectors 37A and 37B and the manifold 35 may be returned to their original positions. As described above, with the large-capacity storage apparatus 30 in the second embodiment, the connection connectors 9 may be easily connected to the connection connectors 37A and 37B and may be easily disconnected from them.

The large-capacity storage apparatus 30 may be added during the operation of the storage system 10. In this case, if the supply tube 7 and discharge tube 8 are connected to the external cooling device 20 before they are connected to the large-capacity storage apparatus 30, the coolant is discharged from the discharge tube 8. When the large-capacity storage apparatus 30 is added during the operation of the storage system 10, therefore, the supply tube 7 and discharge tube 8 are first connected to the large-capacity storage apparatus 30, after which they are connected to the external cooling device 20. Similarly, when a large-capacity storage apparatus 30 is removed during the operation of the storage system 10, the supply tube 7 and discharge tube 8 may be first removed from the external cooling device 20.

Although, in the embodiment described above, the cooling plate 39 has been a rigid body, the flow path in the cooling plate 39 and the outer walls of the cooling plate 39 may also be formed with a flexible material so that when the coolant is supplied, the cooling plate 39 is expanded and comes into tight contact with the large-capacity storage apparatus 30.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A cooling device for heat-generating devices that are removably inserted into a plurality of slots formed in a cabinet of an electronic apparatus, the cooling device comprising:
    a first cooling device provided in the electronic apparatus;
    a second cooling device provided outside the electronic apparatus; and
    flexible tubes that interconnect the first cooling device and the second cooling device so that a coolant is circulated;
    wherein the first cooling device includes a coolant flow path that is connected to one end of one of the flexible tubes, the coolant flow path provided between side surfaces, which face each other, of each pair of adjacent slots of the plurality of slots,
    wherein the second cooling device includes a connector connected to another end of the one of the flexible tubes, a cooling unit that cools the coolant, which enters the second cooling device through another one of the flexible tubes, and a pump that feeds out the coolant, which has been cooled, to the one of the flexible tubes through the connector, and
    wherein the second cooling device is capable of being connected through the flexible tubes to the first cooling device provided in the electronic apparatus.

2. The cooling device according to claim 1, wherein respective ends of the flexible tubes are connected to a first connector into which the coolant flows and to a second connector from which the coolant is discharged, the first connector and the second connector being provided on the first cooling device,
    wherein a coolant inlet of the coolant flow path is connected to the first connector through a first manifold, and
    wherein a coolant outlet of the coolant flow path is connected to the second connector through a second manifold.

3. The cooling device according to claim 2, wherein the first connector includes a connector part connected to the one of the flexible tubes and a base connected to the first manifold and the second connector includes a connector part connected to the another one of the flexible tubes and a base connected to the second manifold.

4. The cooling device according to claim 3,
    wherein the first connector and the second connector are secured to the electronic apparatus.

5. The cooling device according to claim 4,
    wherein the first manifold and the second manifold each include a main tube connected to the base and branching tubes that branch from the main tube and are connected to the coolant inlets and the coolant outlets.

6. The cooling device according to claim 3, wherein the first connector and the second connector are provided so as to be pulled from a front of the electronic apparatus.

7. The cooling device according to claim 6,
    wherein the first manifold and the second manifold each include a flow path branching part, which is connected to the base and broaches a flow path into branching flow paths, and also include flexible pipes that connect the branching flow paths to the coolant inlets and to the coolant outlets.

8. The cooling device according to claim 3, wherein the first connector and second connector connected to the respective ends of the flexible tubes and the connector connected to the another end of the one of the flexible tubes include an opening/closing valve that opens a flow path when the flexible tubes are connected and closes the flow path when the flexible tubes are removed.

9. The cooling device according to claim 1,
    wherein the coolant flow path is meandering in the first cooling device.

10. The cooling device according to claim 1, wherein the cooling unit provided in the second cooling device includes
    a coolant tank in which the coolant is temporarily stored, and
    a heat sink that cools the coolant stored in the coolant tank.

11. The cooling device according to claim 10, wherein the cooling unit further includes an air blowing member that encourages a cooling effect by the heat sink.

12. The cooling device according to claim 10, wherein an additional tank, which is capable of increasing a capacity of the coolant tank, is connected to the coolant tank when the number of electronic apparatuses connected to the second cooling device is increased.

13. The cooling device according to claim 1, wherein the second cooling device is placed at one of atop and below the electronic apparatus, and wherein the flexible tubes are formed to a length that is adequate for a distance between the second cooling device and the electronic apparatus.

14. The cooling device according to claim 1, wherein respective ends of the flexible tubes are connected to a first connector into which the coolant flows and to a second connector from which the coolant is discharged, the first connector being arranged adjacent to the second connector on the first cooling device,
    wherein a coolant inlet of the coolant flow path is connected to the first connector through a first manifold extending along a side of the cabinet, and
    wherein a coolant outlet of the coolant flow path is connected to the second connector through a second manifold extending along the side of the cabinet and in parallel with the first manifold.

15. A storage system formed by stacking a plurality of electronic apparatuses, each of which has a plurality of slots into which a plurality of storage devices are removably inserted, in shelves of a rack, the system comprising a cooling device that includes a first cooling device provided in the electronic apparatus, a second cooling device provided outside the electronic apparatus, and flexible tubes that interconnect the first cooling device and the second cooling device so that a coolant is circulated,
    wherein the first cooling device includes a coolant flow path that is connected to one end of one of the flexible tubes, the coolant flow path provided between side surfaces, which face each other, of each pair of adjacent slots of the plurality of slots,
    wherein the second cooling device includes a connector connected to another end of the one of the flexible tubes, a cooling unit that cools the coolant, which enters the second cooling device through another one of the flexible tubes, and a pump that feeds out the coolant, which has been cooled, to the one of the flexible tubes flexible tube through the connector, and wherein the second cooling device is capable of being connected through the flexible tubes to the first cooling device provided in each of the plurality of electronic apparatuses.

16. The storage system according to claim 15, wherein respective ends of the flexible tubes are connected to a first connector into which the coolant flows and to a second connector from which the coolant is discharged, the first connector being arranged adjacent to the second connector on the first cooling device, wherein a coolant inlet of the coolant flow path is connected to the first connector through a first manifold extending along a side of the cabinet, and wherein a coolant outlet of the coolant flow path is connected to the second connector through a second manifold extending along the side of the cabinet and in parallel with the first manifold.

17. The storage system according to claim 15, wherein respective ends of the flexible tubes are connected to a first connector into which the coolant flows and to a second connector from which the coolant is discharged, the first connector and the second connector being provided on the first cooling device, wherein a coolant inlet of the coolant flow path is connected to the first connector through a first manifold, and wherein a coolant outlet of the coolant flow path is connected to the second connector through a second manifold.

18. The storage system according to claim 17, wherein the first connector includes a connector part connected to the one of the flexible tubes and a base connected to the first manifold and the second connector includes a connector part connected to the another one of the flexible tubes and a base connected to the second manifold.

19. The storage system according to claim 15, wherein the coolant flow path is meandering in the first cooling device.

20. The cooling device according to claim 15, wherein the cooling unit provided in the second cooling device includes a coolant tank in which the coolant is temporarily stored, and a heat sink that cools the coolant stored in the coolant tank.

* * * * *